(12) United States Patent
Wang et al.

(10) Patent No.: US 6,371,805 B1
(45) Date of Patent: Apr. 16, 2002

(54) CABLE ASSEMBLY AND METHOD FOR MAKING THE SAME

(75) Inventors: Wenli Wang; Jianhua Dai, both of Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/752,286

(22) Filed: Dec. 28, 2000

(51) Int. Cl.[7] .................................................. H01R 9/09
(52) U.S. Cl. ........................................................ 439/581
(58) Field of Search ................................. 439/581, 580, 439/610, 63, 79, 579, 98

(56) References Cited

U.S. PATENT DOCUMENTS 4,602,832 A * 7/1986 Cunningham et al. ...... 439/579
4,993,968 A * 2/1991 Guletsky et al. ............ 439/579
5,046,966 A * 9/1991 Snyder et al. ............... 439/579
5,241,135 A * 8/1993 Fetzer ......................... 439/579
5,735,695 A * 4/1998 Heinrich ..................... 439/581
6,007,347 A * 12/1999 Keldsen et al. ............. 439/581

* cited by examiner

Primary Examiner—Gary F. Paumen
Assistant Examiner—James R. Harvey
(74) Attorney, Agent, or Firm—Wei Te Chung

(57) ABSTRACT

An electrical cable assembly (1) includes an electrical coaxial cable (2), an electrical cable end connector (3) and a printed circuit board (4). The printed circuit board is electrically connected to and supported by the electrical cable end connector. The cable comprises a plurality of wires (21) extending through and physically retained by the printed circuit board. Each wire comprises an electrical center conductor (210) and a metallic braid (211) shielding the electrical center conductor. The electrical center conductor and the metallic braid are soldered to the printed circuit board.

1 Claim, 9 Drawing Sheets

CABLE ASSEMBLY AND METHOD FOR MAKING THE SAME

BACKGROUND OF THE INVENTION

1. Field of the Invention

The present invention relates to the field of electrical cable assemblies, and particularly to an electrical cable assembly comprising an electrical cable end connector and an electrical coaxial cable electrically connected to the electrical cable end connector, and a method for making the electrical cable assembly.

2. Description of the Prior Art

Referring to FIG. 12, an electrical cable end connector (not shown) of a conventional electrical cable assembly is connected to a coaxial cable 8 using an intermediary printed circuit board 9. Center conductors 811 of wires 81 of the coaxial cable 8 are electrically connected to solder pads 91 on one side face of the printed circuit board 9. Metallic braids 812 of the wires 81 are electrically connected to solder pads (not shown) on an opposite side face of the printed circuit board 9. When the number of the wires 81 is large, directly soldering the conductors 811 and the metallic braids 812 to the printed circuit board 9 without providing a pre-support to the wires 81 is inefficient and time-consuming, and yields unreliable quality in the end product. Additionally, the conventional cable assembly is not very durable since the printed circuit board/coaxial cable connection is easily destroyed when an outward pull force is applied to the cable 8.

Therefore, an improved electrical cable assembly and a method for making the same are required to overcome the disadvantages of the prior art.

SUMMARY OF THE INVENTION

A first object of the present invention is to provide an electrical cable assembly having reliable quality; and A second object of the present invention is to provide an efficient and reliable method for making an electrical cable assembly.

An electrical cable assembly in accordance with the present invention comprises an electrical cable end connector, a printed circuit board and a coaxial cable electrically connected to the electrical cable end connector by way of the printed circuit board. The cable end connector comprises an insulative housing supporting the printed circuit board and a plurality of electrical contacts mounted in the insulative housing and electrically connected to the printed circuit board. The coaxial cable comprises a plurality of wires each comprising an electrical conductor and a metallic braid coaxially shielding the electrical conductor. The wires of the coaxial cable extend through the printed circuit board from one side face to a second side face of the printed circuit board. The metallic braids and the electrical conductors of the coaxial cable are respectively soldered to different rows of solder pads on the second side face of the printed circuit board.

A method for making the electrical cable assembly comprises the steps of: 1). providing an electrical cable end connector comprising an insulative housing and a plurality of electrical contacts mounted in the insulative housing; 2). providing a printed circuit board having first and second parallel rows of soldering pads on one side face thereof; 3). providing a coaxial cable comprising a plurality of wires each comprising an electrical center conductor and a metallic braid shielding the electrical center conductor; 4). extending the wires of the coaxial cable through the printed circuit board and retaining the wires between the two parallel rows of solder pads of the printed circuit board; 5). stripping off the metallic braids of the wires and exposing the electrical center conductors; 6). soldering the electrical center conductors and the metallic braids to the first and second rows of solder pads, respectively; and 7). engaging the printed circuit board with the insulative housing and electrically connecting the electrical contacts to the printed circuit board.

Other objects, advantages and novel features of the invention will become more apparent from the following detailed description of the present embodiment when taken in conjunction with the accompanying drawings.

DETAILED DESCRIPTION OF THE INVENTION

Figure 1:
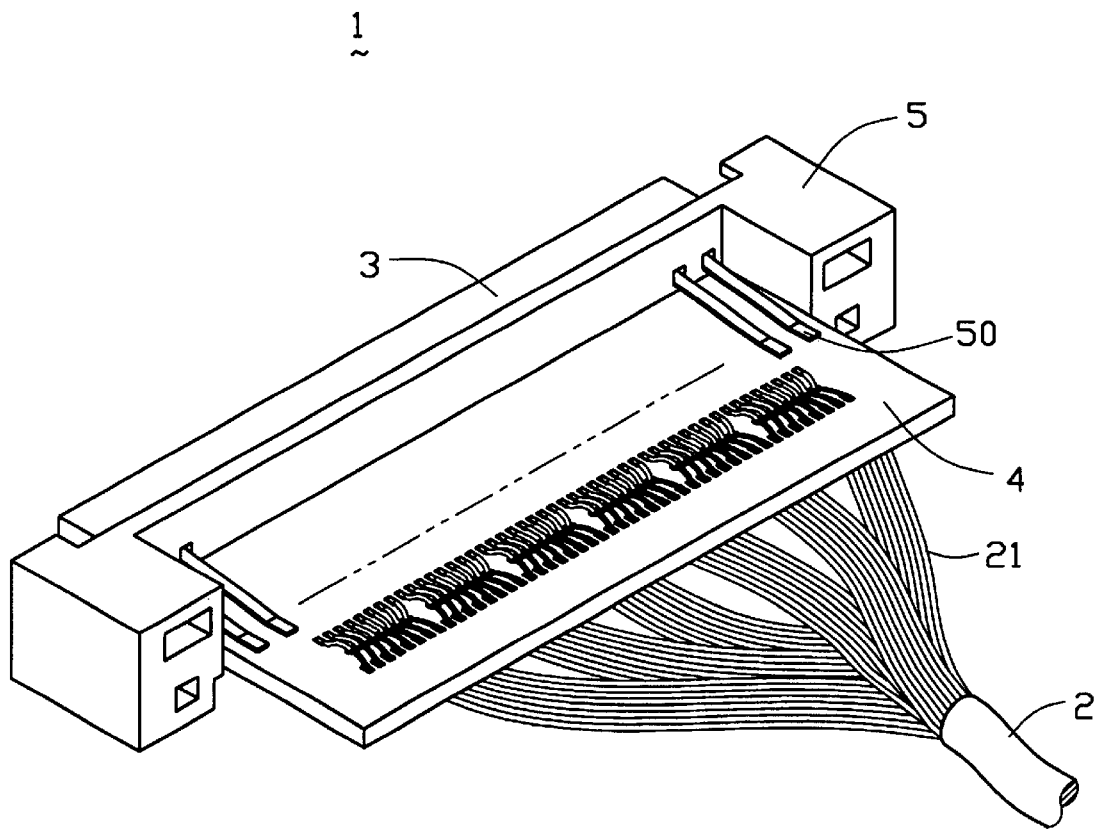
FIG. 1 is a perspective view of an electrical cable assembly in accordance with a first embodiment of the present invention.

Referring to FIG. 1, an electrical cable assembly 1 in accordance with a first embodiment of the present invention comprises an electrical coaxial cable 2, an electrical cable end connector 3 and a printed circuit board 4.

Figure 5:
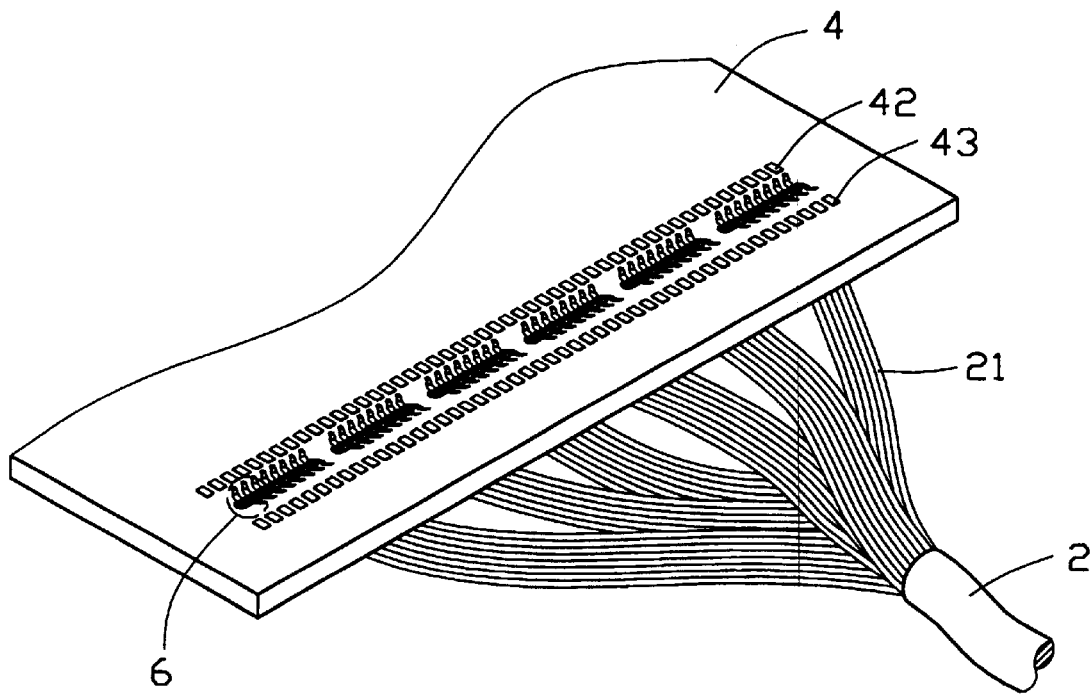
FIG. 5 is similar to FIG. 4, but metallic braids of the wires are stripped off.

Referring also to FIG. 5, the coaxial cable 2 comprises a plurality of parallel wires 21 longitudinally extending along a length thereof. Each wire 21 comprises an electrical center conductor 210, a dielectric layer 212 surrounding the electrical center conductor 210, a metallic braid 211 overlaying the dielectric layer 212 and an outer insulative jacket 22 overlaying the metallic braid 211.

The electrical cable end connector 3 comprises an insulative housing 5 and a plurality of electrical contacts 50 mounted in the insulative housing 5.

Figure 2:
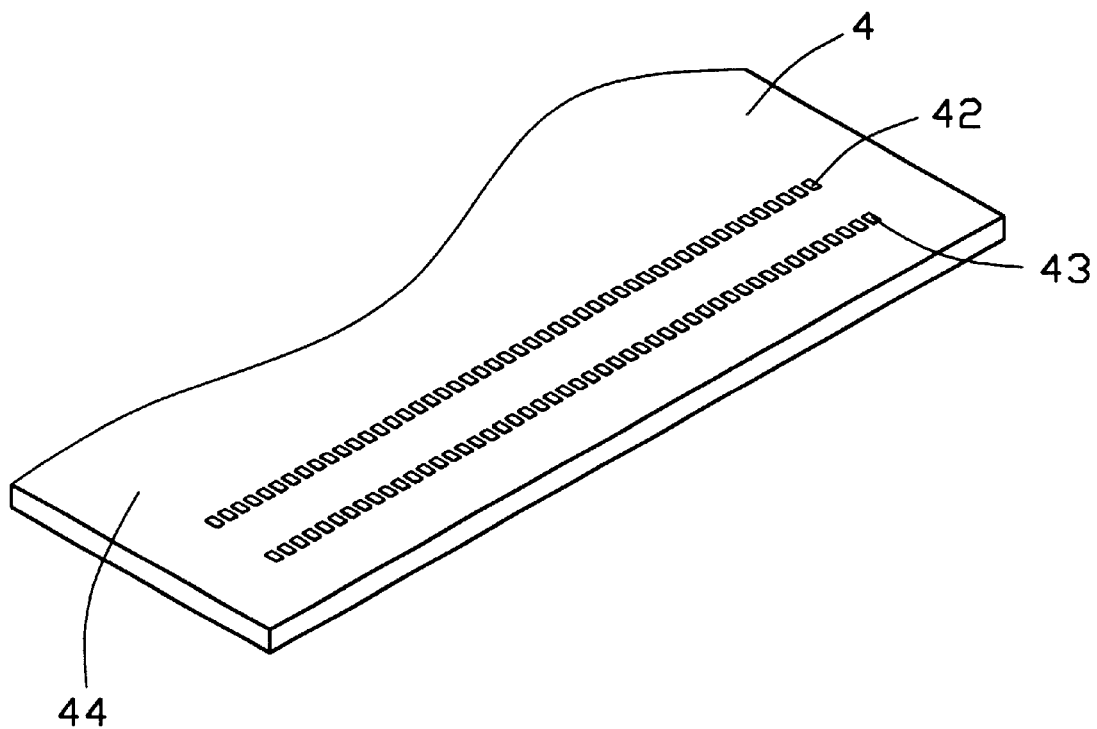
FIG. 2 is a perspective view of a printed circuit board of the electrical cable assembly of FIG. 1, with two rows of solder pads thereon.
Figure 3:
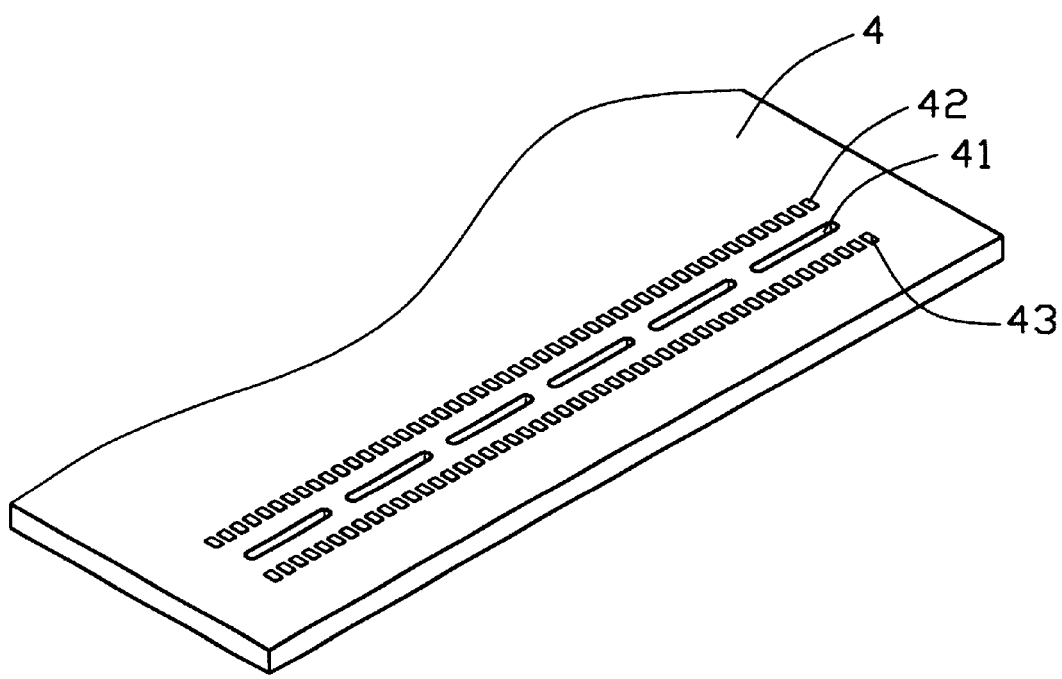
FIG. 3 is similar to FIG. 2, but a row of slots are defined between the two rows of solder pads.

Referring also to FIG. 3, the printed circuit board 4 defines first and second parallel rows of solder pads 42, 43 on one side face 44 (shown in FIG. 2) thereof and a row of slots 41 between and parallel to the first and second rows of solder pads 42, 43. A number of the solder pads 42 in the first row is equal to that of the solder pads 43 in the second row and is equal to that of the wires 21 of the coaxial cable 2. A number of the slots 41 is less than that of the solder pads 43 in the second row. The printed circuit board 4 comprises electrical circuits (not shown) thereon electrically connected to the solder pads 42, 43 and contact pads (not shown) engageable with the electrical contacts 50.

Figure 4:
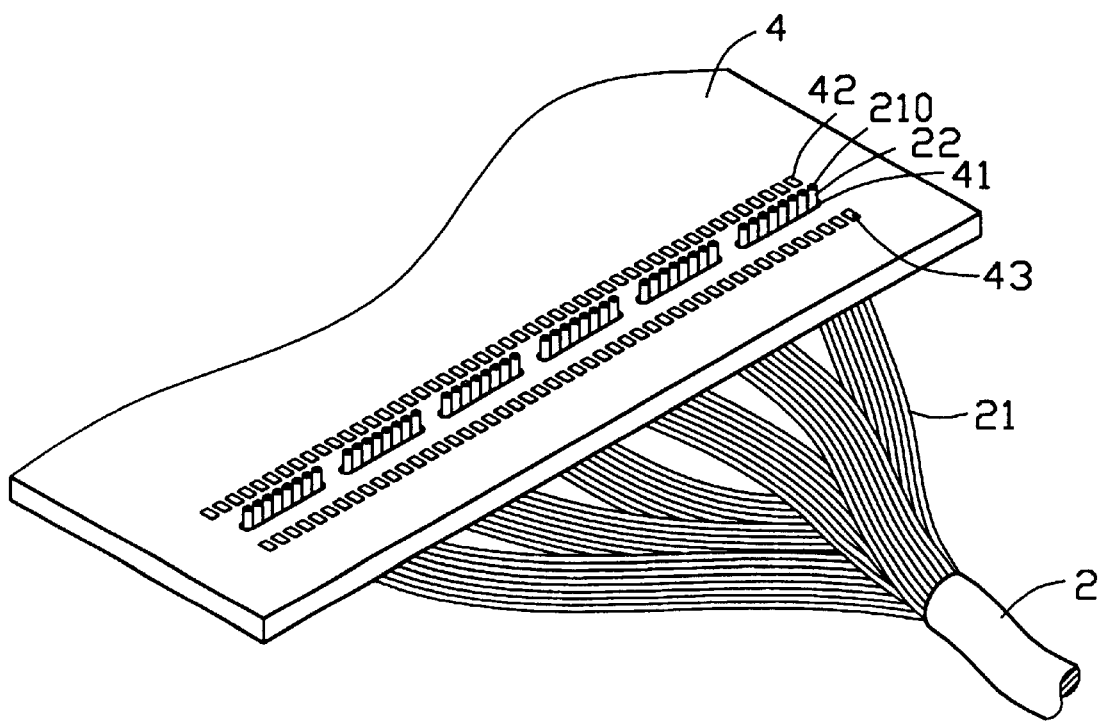
FIG. 4 is similar to FIG. 3, but wires of a coaxial cable are inserted through and retained by the row of slots of the printed circuit board.
Figure 6:
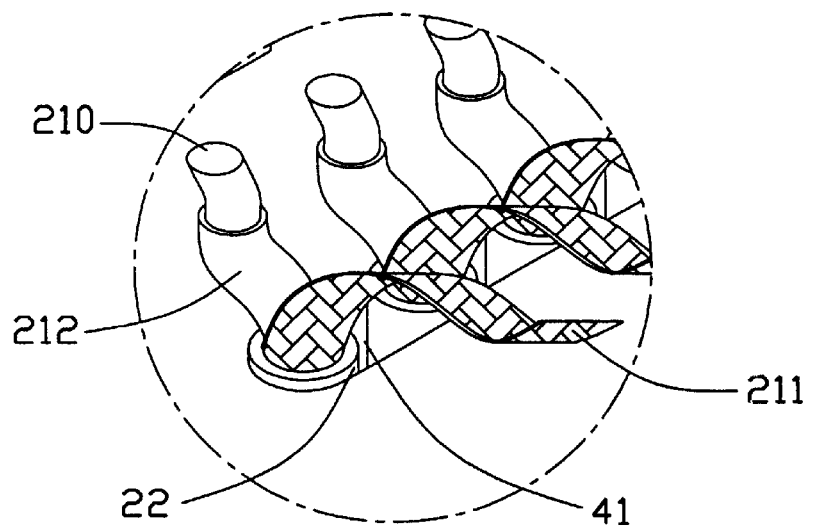
FIG. 6 is a partially enlarged view taken from FIG. 5, designated as "6" in FIG. 5.
Figure 7:
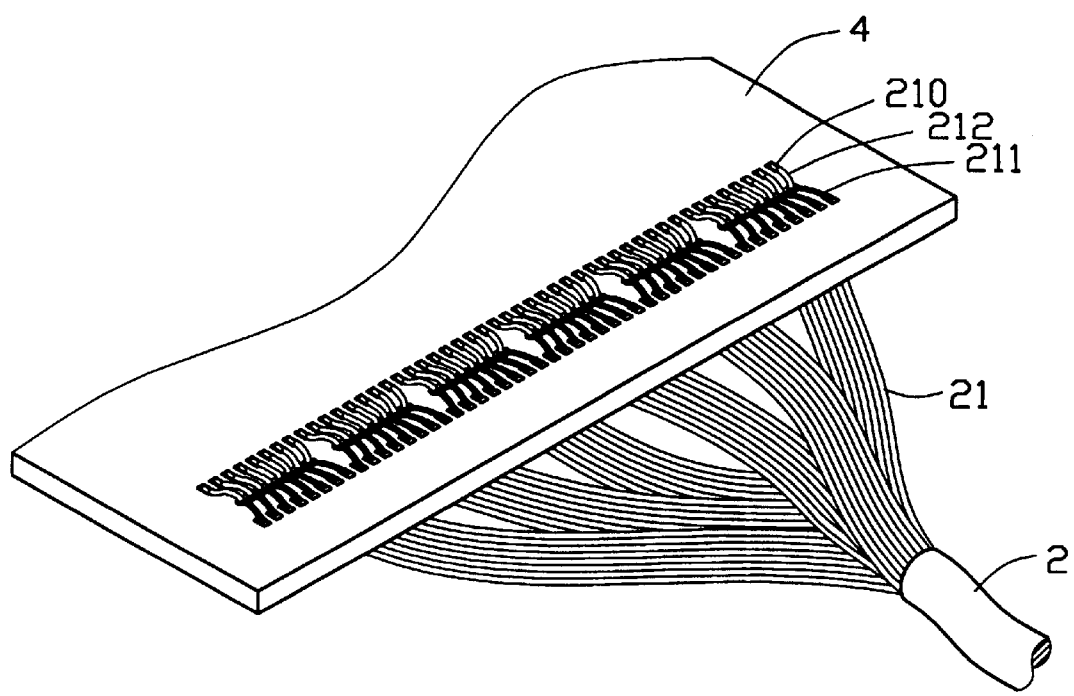
FIG. 7 is similar to FIG. 5, but the metallic braids and the electrical conductors of the wires are soldered to the solder pads of the printed circuit board, respectively.

A method for making the electrical cable assembly 1 in accordance with the first embodiment of the present invention comprises the following steps:

1). providing the electrical cable end connector 3 with the insulative housing 5 and the electrical contacts 50;

2). providing the printed circuit board 4 with the first and second rows of solder pads 42, 43 on the side face 44 thereof, as shown in FIG. 2, a number of the solder pads 42 in the first row being equal to that of the solder pads 43 in the second row;

3). defining the row of slots 41 between and parallel to the first and second rows of solder pads 42, 43, a number of the slots being less than that of the solder pads 43 in the second row;

4). providing the coaxial cable 2 comprising the plurality of wires 21, the number of the wires 21 being equal to the number of the solder pads 43 in the second row;

5). extending the wires 21 through and retaining the wires 21 in the slots 41 of the printed circuit board 4 with each slot 41 receiving more than one wire 21 therein, as shown in FIG. 4;

6). stripping off the metallic braids 211 and exposing the electrical center conductors 210 as shown in FIGS. 5 and 6;

7). soldering the electrical center conductors 210 and the metallic braids 211 to the solder pads 42, 43, respectively, as shown in FIG. 7, so that the wires 21 are electrically connected with the electrical circuits on the printed circuit board 4; and 8). engaging the printed circuit board 4 with the insulative housing 5 and electrically connecting the electrical contacts 50 to the printed circuit board 4.

Figure 8:
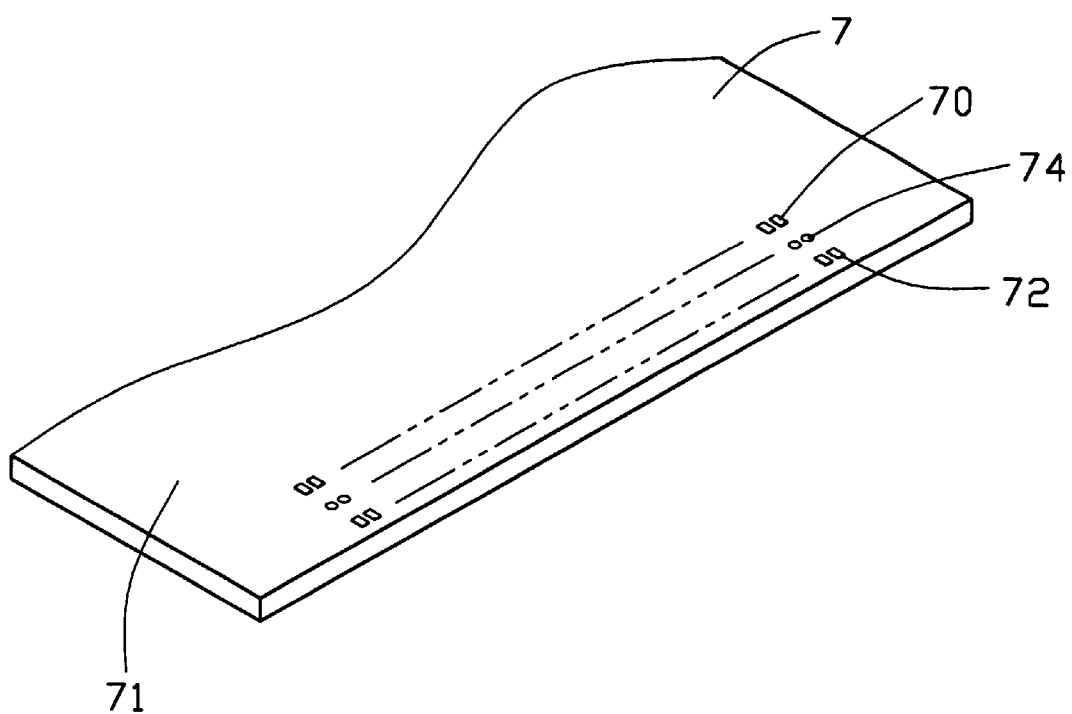
FIG. 8 is a printed circuit board formed in accordance with a second embodiment of the present invention.
Figure 9:
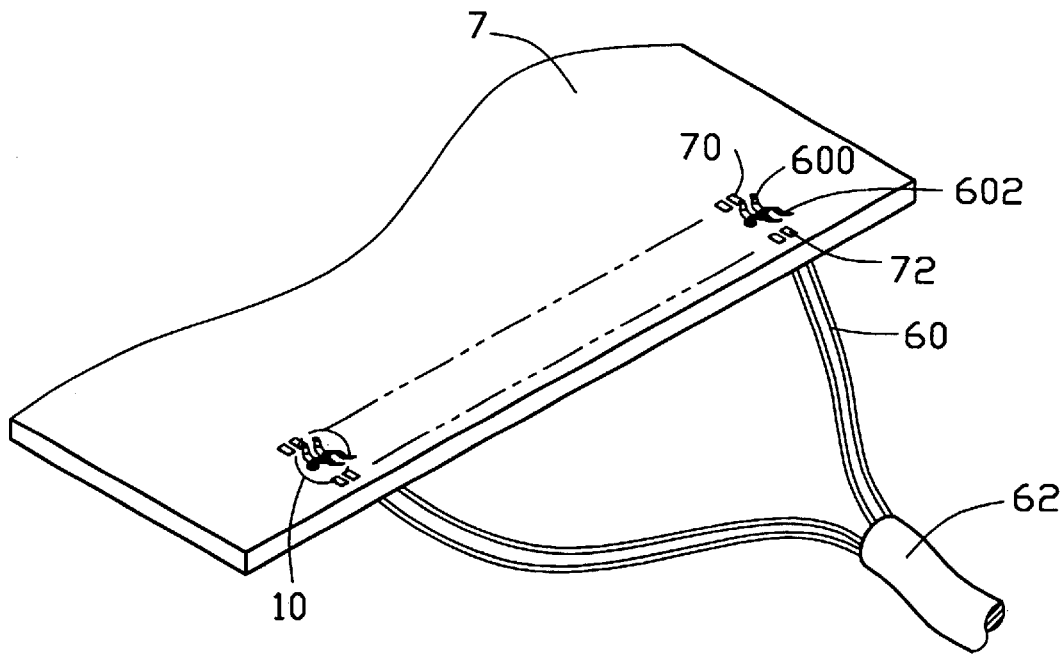
FIG. 9 is similar to FIG. 8, but wires of a coaxial cable extend through the printed circuit board with metallic braids thereof being stripped off therefrom.

Referring to FIG. 8, a printed circuit board 7 of an electrical cable assembly (not shown) in accordance with a second embodiment of the present invention is similar to the printed circuit board 4 of the first embodiment. The printed circuit board 7 comprises first and second rows of solder pads 70, 72 on one side face 71 of the printed circuit board 7. A plurality of holes 74 is defined through the printed circuit board 7 arranged in one row between and parallel to the first and second rows of solder pads 70, 72. A number of the holes 74 is equal to a number of the wires 21 of the cable 2 and to the number of the solder pads 70 in the first row and to the number of the solder pads 72 in the second row. The printed circuit board 7 also defines electrical circuits (not shown) thereon for electrically connecting the solder pads 70, 72 with contact pads (not shown) engageable with the electrical contacts 50 of the electrical cable end connector 3.

Figure 10:
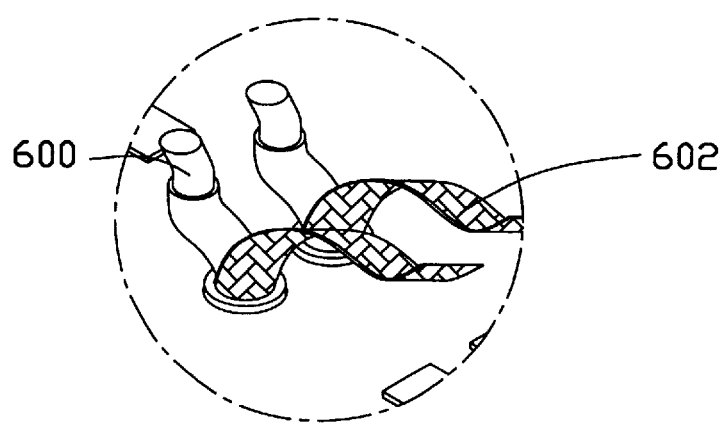
FIG. 10 is a partially enlarged view taken from FIG. 9, designated as "10" in FIG. 9.
Figure 11:
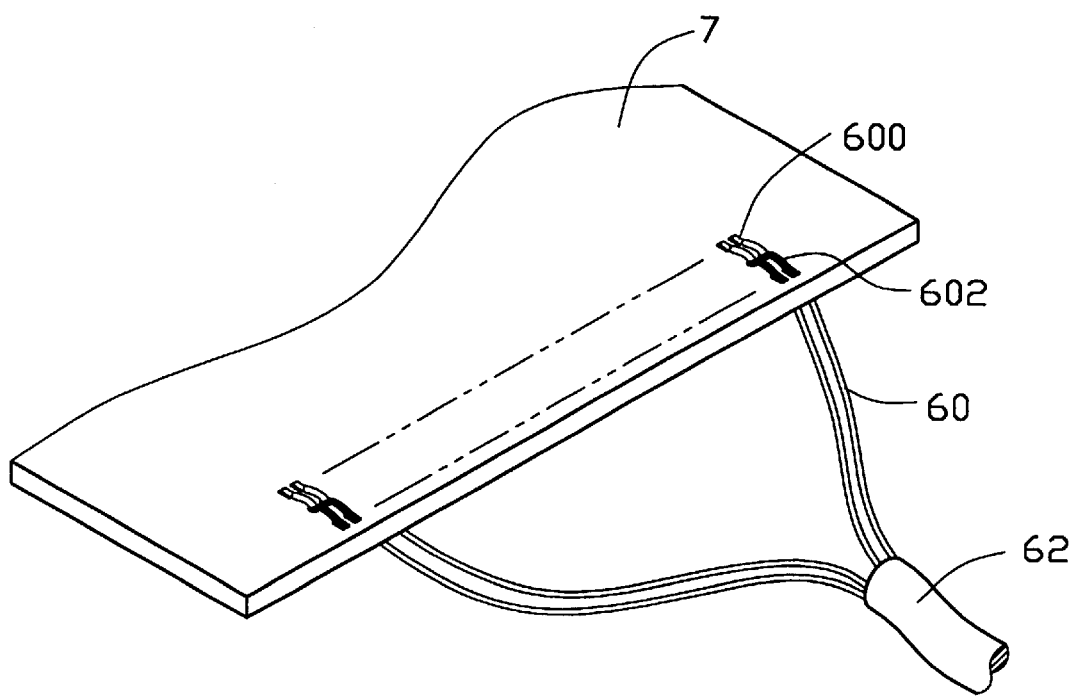
FIG. 11 is similar to FIG. 9, but the metallic braids and the electrical center conductors are respectively soldered to solder pads of the printed circuit board.
Figure 12:
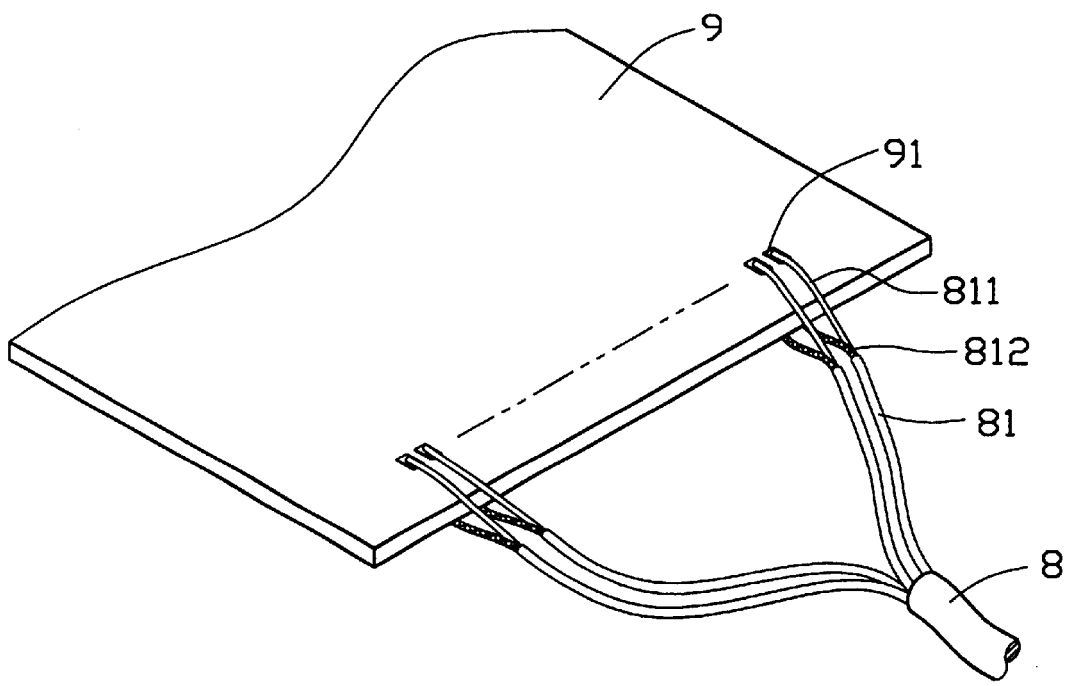
FIG. 12 is a perspective view of a printed circuit board and a coaxial cable of a conventional electrical cable assembly.

The method for making the electrical cable assembly in accordance with the second embodiment of the present invention is similar to that of the first embodiment. Like reference numerals are applied to like components of the second embodiment except that the printed circuit board is designated as 7 and the coaxial cable is designated as 62. The method comprises the following steps:

1). providing the electrical cable end connector 3 with the insulative housing 5 and the electrical contacts 50;

2). providing the printed circuit board 7 with the first and second rows of solder pads 70, 72 on the side face 71 thereof, as shown in FIG. 8, the number of the solder pads 70 in the first row being equal to the number of the solder pads 72 in the second row;

3). defining the row of holes 74 between and parallel to the first and second rows of solder pads 70, 72, a number of the holes 74 being equal to the number of the solder pads 72 in the second row;

4). providing a coaxial cable 62 comprising a plurality of the wires 60, a number of the wires 60 being equal to the number of the solder pads 72 in the second row and the number of the holes 74;

5). extending the wires 60 through and retaining the wires 60 to the holes 74 of the printed circuit board 7, with each hole 74 receiving only one wire 60 therethrough;

6). stripping off the metallic braids 602 and exposing the electrical center conductors 600 as shown in FIG. 10;

7). soldering the electrical center conductors 600 and the metallic braids 602 to the solder pads 70, 72, respectively, as shown in FIG. 11; and 8). engaging the printed circuit board 7 with the insulative housing 5 and electrically connecting the electrical contacts 50 to the printed circuit board 7.

The slots 41 and the holes 74 of the printed circuit board 4, 7 support the wires 21, 60 before the center conductors 210, 600 and the metallic braids 211, 602 are soldered to the printed circuit board 4, 7. Therefore, the quality of the printed circuit board/coaxial cable connection is reliable and the method for making the electrical cable assembly is efficient. Further, the center conductor to solder pad electrical connection is protected since the engagement between the wires 21 and the slots 41 or holes 74 protects the connection when an outward pull force is applied to the cable 2, 62.

It is to be understood, however, that even though numerous characteristics and advantages of the present invention have been set fourth in the forgoing description, together with details of the structure and function of the invention, the disclosure id illustrative only, and changes may be made in detailed, especially in matters of shape, size, and arrangement of parts within the principles of the invention to the full extent indicated by the board general meaning of the terms in which the appended claims are expressed.

What is claimed is:

1. An electrical cable assembly comprising:

an electrical connector comprising an insulative housing and a plurality of electrical contacts mounted in the insulative housing;

a printed circuit board supported by the insulative housing and electrically connected to the electrical contacts, the printed circuit board defining first and second rows of solder pads on one side face thereof; and an electrical coaxial cable comprising a plurality of wires, each wire comprising an electrical center conductor and a metallic braid shielding the center conductor, the wires extending through and retained by the printed circuit board, the center conductors and the metallic braids being soldered to the solder pads in the first and second rows, respectively;

wherein a number of the solder pads in the first row is equal to that of the solder pads in the second row and is equal to that of the wires of the coaxial cable;

wherein the printed circuit board defines a row of slots extending therethrough, a number of the slots being less than that of the solder pads in any one of the first and second rows so that each slot receives more than one wire therethrough;

wherein the first and second rows of solder pads are parallel to each other and the row of slots are defined between and parallel to the first and second rows of solder pads.

\* \* \* \* \*